United States Patent
Iizuka

(10) Patent No.: US 8,366,828 B2
(45) Date of Patent: Feb. 5, 2013

(54) SHOWER HEAD AND SUBSTRATE PROCESSING APPARATUS

(75) Inventor: Hachishiro Iizuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 711 days.

(21) Appl. No.: 12/406,339

(22) Filed: Mar. 18, 2009

(65) Prior Publication Data

US 2009/0236041 A1 Sep. 24, 2009

Related U.S. Application Data

(60) Provisional application No. 61/050,655, filed on May 6, 2008.

(30) Foreign Application Priority Data

Mar. 19, 2008 (JP) ................................. 2008-071475
Jan. 9, 2009 (JP) ................................. 2009-003913

(51) Int. Cl.
C23C 16/455 (2006.01)
C23C 16/52 (2006.01)
C23F 16/00 (2006.01)
H01L 21/306 (2006.01)
C23C 16/06 (2006.01)
C23C 16/22 (2006.01)

(52) U.S. Cl. .............. 118/715; 156/345.24; 156/345.26; 156/345.34

(58) Field of Classification Search .................. 118/715; 156/345.24, 345.26, 345.34
See application file for complete search history.

(56) References Cited

U.S. PATENT DOCUMENTS

| 4,209,357 | A | * | 6/1980 | Gorin et al. .................... 438/710 |
| 4,579,618 | A | * | 4/1986 | Celestino et al. ......... 156/345.44 |
| 4,590,042 | A | * | 5/1986 | Drage ..................... 422/186.06 |
| 4,793,975 | A | * | 12/1988 | Drage ..................... 422/186.05 |
| 5,380,396 | A | * | 1/1995 | Shikida et al. ..................... 216/2 |
| 5,565,249 | A | * | 10/1996 | Kurihara et al. .............. 427/577 |
| 5,578,130 | A | * | 11/1996 | Hayashi et al. ........... 118/723 E |

(Continued)

FOREIGN PATENT DOCUMENTS

| JP | 61-174388 A | 8/1986 |
| JP | 2-234419 A | 9/1990 |

(Continued)

*Primary Examiner* — Rudy Zervigon
(74) *Attorney, Agent, or Firm* — Rothwell, Figg, Ernst & Manbeck, P.C.

(57) ABSTRACT

A shower head is provided in a processing chamber for processing a substrate therein to face a mounting table for mounting thereon the substrate and formed of a laminated body in which a plurality of plate-shaped members are laminated. The shower head serves to supply one or more gases in a shower shape toward the substrate. The shower head includes a first gas supply unit for supplying a first gas toward the substrate through first gas injection openings provided in the laminated body, a second gas supply unit for supplying a second gas through second gas injection openings provided in the laminated body and a plurality of gas exhaust holes, formed through the laminated body, for exhausting a gas through a portion of the laminated body, the portion facing the mounting table.

20 Claims, 10 Drawing Sheets

U.S. PATENT DOCUMENTS

| | | | |
|---|---|---|---|
| 5,582,866 A | 12/1996 | White | |
| 6,537,418 B1 * | 3/2003 | Muller et al. | 156/345.34 |
| 6,821,910 B2 * | 11/2004 | Adomaitis et al. | 438/758 |
| 7,267,724 B2 * | 9/2007 | Tanaka et al. | 118/715 |
| 7,273,526 B2 * | 9/2007 | Shinriki et al. | 118/715 |
| 7,452,827 B2 * | 11/2008 | Gianoulakis et al. | 438/778 |
| 7,456,429 B2 * | 11/2008 | Levy | 257/66 |
| 7,481,886 B2 * | 1/2009 | Kato et al. | 118/715 |
| 7,572,686 B2 * | 8/2009 | Levy et al. | 438/149 |
| 7,789,961 B2 * | 9/2010 | Nelson et al. | 118/715 |
| 7,850,780 B2 * | 12/2010 | Levy et al. | 118/715 |
| 8,182,608 B2 * | 5/2012 | Kerr et al. | 118/719 |
| 2001/0004881 A1 * | 6/2001 | Miller et al. | 118/729 |
| 2004/0099213 A1 * | 5/2004 | Adomaitis et al. | 118/715 |
| 2005/0103265 A1 * | 5/2005 | Gianoulakis et al. | 118/715 |
| 2005/0208217 A1 | 9/2005 | Shinriki et al. | |
| 2005/0229848 A1 * | 10/2005 | Shinriki et al. | 118/715 |
| 2005/0279731 A1 * | 12/2005 | Saito et al. | 216/58 |
| 2006/0021574 A1 * | 2/2006 | Armour et al. | 118/715 |
| 2006/0234514 A1 * | 10/2006 | Gianoulakis et al. | 438/758 |
| 2007/0228470 A1 * | 10/2007 | Levy | 257/348 |
| 2008/0166880 A1 * | 7/2008 | Levy | 438/758 |
| 2008/0166884 A1 * | 7/2008 | Nelson et al. | 438/765 |
| 2009/0078204 A1 * | 3/2009 | Kerr et al. | 118/728 |
| 2009/0081366 A1 * | 3/2009 | Kerr et al. | 427/255.28 |
| 2009/0081886 A1 * | 3/2009 | Levy et al. | 438/790 |
| 2009/0211707 A1 * | 8/2009 | Chao et al. | 156/345.34 |
| 2009/0236041 A1 * | 9/2009 | Iizuka | 156/345.34 |
| 2010/0300359 A1 * | 12/2010 | Armour et al. | 118/724 |
| 2011/0067815 A1 * | 3/2011 | Iizuka et al. | 156/345.26 |
| 2011/0132542 A1 * | 6/2011 | Iizuka | 156/345.33 |
| 2011/0214814 A1 * | 9/2011 | Iizuka et al. | 156/345.34 |

FOREIGN PATENT DOCUMENTS

| | | |
|---|---|---|
| JP | 2662365 | 6/1997 |
| JP | 2004-339566 | 12/2004 |
| JP | 2005-113268 | 4/2005 |
| JP | 2005-303292 | 10/2005 |
| JP | 2006-19552 | 1/2006 |
| JP | 2006-165173 | 6/2006 |
| JP | 2007-227375 A | 9/2007 |

* cited by examiner

SHOWER HEAD AND SUBSTRATE PROCESSING APPARATUS

FIELD OF THE INVENTION

The present invention relates to a shower head and a substrate processing apparatus which are used for plasma processing of a substrate or the like.

BACKGROUND OF THE INVENTION

Conventionally, in, e.g., a manufacturing process of a semiconductor device, a substrate processing apparatus for processing a substrate while supplying a gas in a shower shape through a shower head disposed to face a substrate has been used as a processing apparatus for processing a substrate such as a semiconductor wafer or a glass substrate for use in a liquid crystal display or the like.

For example, in a plasma processing apparatus for performing plasma processing such as an etching process or a film forming process on a substrate disposed in a processing chamber by using a plasma generated from a processing gas in the processing chamber, the shower head forms an electrode facing a mounting table for mounting thereon the substrate. Further, a predetermined processing gas is supplied in a shower shape through the shower head, and is discharged through a periphery of the mounting table (substrate) toward a lower portion of the processing chamber. Furthermore, a plasma of the processing gas is generated by a high frequency power applied to a space between the shower head and the mounting table.

Further, there is known a plasma processing apparatus in which a gas is discharged through the periphery of the shower head toward an upper portion of the processing chamber (see, e.g., Japanese Patent Publication No. 2662365).

In the above prior arts, a gas is arranged to be discharged at the periphery of the mounting table (substrate) toward the lower portion of the processing chamber or at the periphery of the shower head toward the upper portion of the processing chamber. Therefore, the gas supplied through the shower head flows from a central portion to a peripheral portion of the substrate, thereby making a processing state at the central portion of the substrate different from that at the peripheral portion of the substrate, resulting in deteriorating in-plane uniformity of the processing. Further, a gas exhaust channel needs to be provided at a periphery of the mounting table (substrate) or that of the shower head, so that the processing chamber is considerably scaled up compared to the substrate accommodated therein, which makes it difficult to scale down the entire apparatus. Moreover, a pressure in the processing space is controlled by adjusting an opening degree of the gas exhaust unit. As a result, responsiveness becomes poor, or fine adjustment becomes difficult.

SUMMARY OF THE INVENTION

In view of the above, the present invention provides a shower head and a substrate processing apparatus capable of being scaled down and enabling a pressure in a processing chamber to be controlled quickly and accurately to thereby improve processing uniformity compared to prior arts.

In accordance with an aspect of the present invention, there is provided a shower head provided in a processing chamber for processing a substrate therein to face a mounting table for mounting thereon the substrate and formed of a laminated body in which a plurality of plate-shaped members are laminated, the shower head serving to supply one or more gases in a shower shape toward the substrate, the shower head including: a first gas supply unit for supplying a first gas toward the substrate through first gas injection openings provided in the laminated body; a second gas supply unit for supplying a second gas through second gas injection openings provided in the laminated body; and a plurality of gas exhaust holes, formed through the laminated body, for exhausting a gas through a portion of the laminated body, the portion facing the mounting table.

The second gas supply unit may supply the second gas toward a side opposite to the substrate.

The second gas supply unit may supply the second gas toward the substrate.

The shower head may further include a third gas supply unit for supplying a third gas through third gas injection openings provided in the laminated body.

The shower head may further include a fourth gas supply unit for supplying a fourth gas through fourth gas injection openings provided in the laminated body.

The shower head may serve as a facing electrode facing the mounting table.

In accordance with an another aspect of the present invention, there is provided a substrate processing apparatus including: a processing chamber for processing a substrate therein; a mounting table, provided in the processing chamber, for mounting thereon the substrate; and a shower head, provided to face the mounting table, for supplying one or more gases in a shower shape toward the substrate, wherein the shower head includes: a first gas supply unit for supplying a first gas toward the substrate through first gas injection openings provided in the laminated body; a second gas supply unit for supplying a second gas through second gas injection openings provided in the laminated body; and a plurality of gas exhaust holes, formed through the laminated body, for exhausting a gas through a portion of the laminated body, the portion facing the mounting table.

The second gas supply unit may supply the second gas toward a side opposite to the substrate.

The second gas supply unit may supply the second gas toward the substrate.

The substrate processing apparatus may further include a third gas supply unit for supplying a third gas through third gas injection openings provided in the laminated body.

The substrate processing apparatus may further include a fourth gas supply unit for supplying a fourth gas through fourth gas injection openings provided in the laminated body.

The shower head may serve as a facing electrode facing the mounting table.

A high frequency power may be applied between the shower head and the mounting table to generate a plasma, and the substrate may be processed by using the plasma.

The substrate may be etched by the plasma.

The present invention can provide a shower head and a substrate processing apparatus, which can be scaled down and enable a pressure in a processing chamber to be controlled quickly and accurately to thereby improve processing uniformity compared to prior arts.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
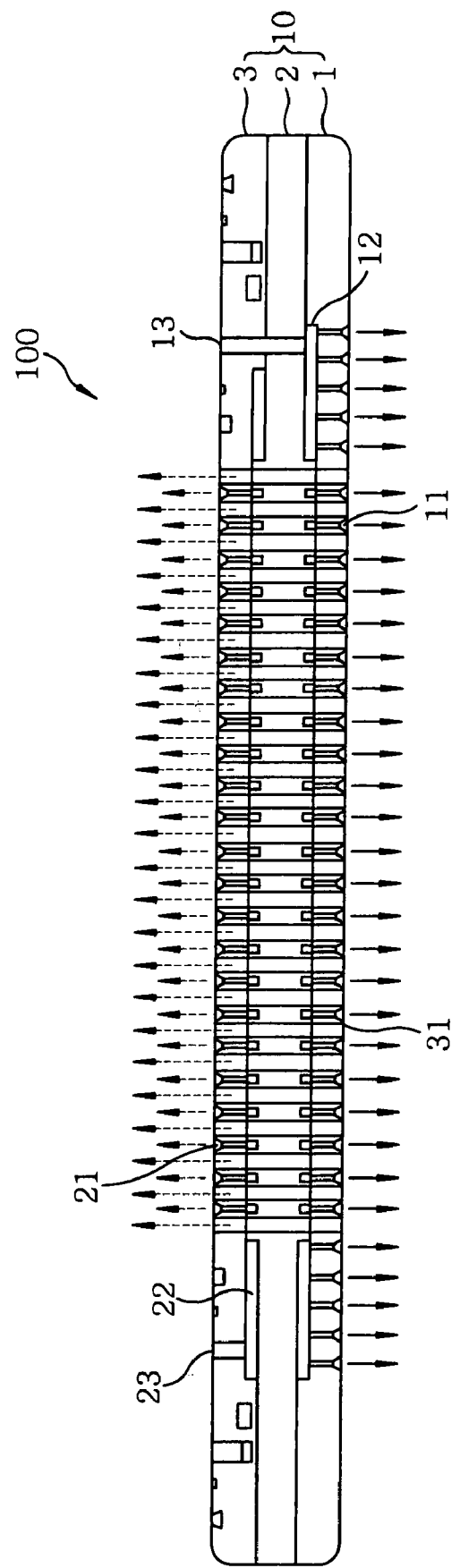
FIG. 1 shows a configuration of a shower head in accordance with a first embodiment of the present invention.

Embodiments of the present invention will be described with reference to the accompanying drawings which form a part hereof. FIG. 1 shows a configuration of a shower head in accordance with the present embodiment.

The shower head 100 is formed as a laminated body 10 by laminating three plate-shaped members including a lower member 1, an intermediate member 2 disposed above the lower member 1 and an upper member 3 provided above the intermediate member 2. The plate-shaped members are made of, e.g., aluminum having an anodically oxidized surface or the like.

A plurality of first gas injection openings 11 is formed at the lower member 1 of the laminated body 10, and a first gas channel 12 communicating with the first gas injection openings 11 is formed between the lower member 1 and the intermediate member 2. Moreover, the first gas channel 12 communicates with a first gas inlet portion 13, which is formed through the intermediate member 2 and the upper member 3 and opens at a top surface of the upper member 3. As indicated by arrows in FIG. 1, the first gas injection openings 11 and the like form a first gas supply mechanism, which supplies a first gas in a shower shape toward a substrate (lower side of FIG. 1).

A plurality of second gas injection openings 21 is formed at the upper member 3, and a second gas channel 22 communicating with the second gas injection openings 21 is formed between the upper member 3 and the intermediate member 2. Further, the second gas channel 22 communicates with a second gas inlet portion 23, which is formed through the upper member 3 and opens at the top surface of the upper member 3. As indicated by arrows in FIG. 1, the second gas injection openings 21 and the like form a second gas supply mechanism, which supplies a second gas in a shower shape toward the opposite side (upper side of FIG. 1) of the substrate.

Further, a plurality of gas exhaust holes 31 is formed in the laminated body 10 through which the gas exhaust holes 31 are formed through the laminated body 10, i.e., the lower member 1, the intermediate member 2 and the upper member 3. As indicated by arrows in FIG. 1, the gas exhaust holes 31 constitute a gas exhaust unit for exhausting a gas so that the gas flows from a substrate (lower side of FIG. 1) toward a side opposite to the substrate (upper side of FIG. 1). The diameter of each of the gas exhaust holes 31 is, e.g., about 3 mm, so that the number of the gas exhaust holes 31 is about 700 to 1000 when processing a semiconductor wafer having a diameter of about 10 inches.

Figure 3:
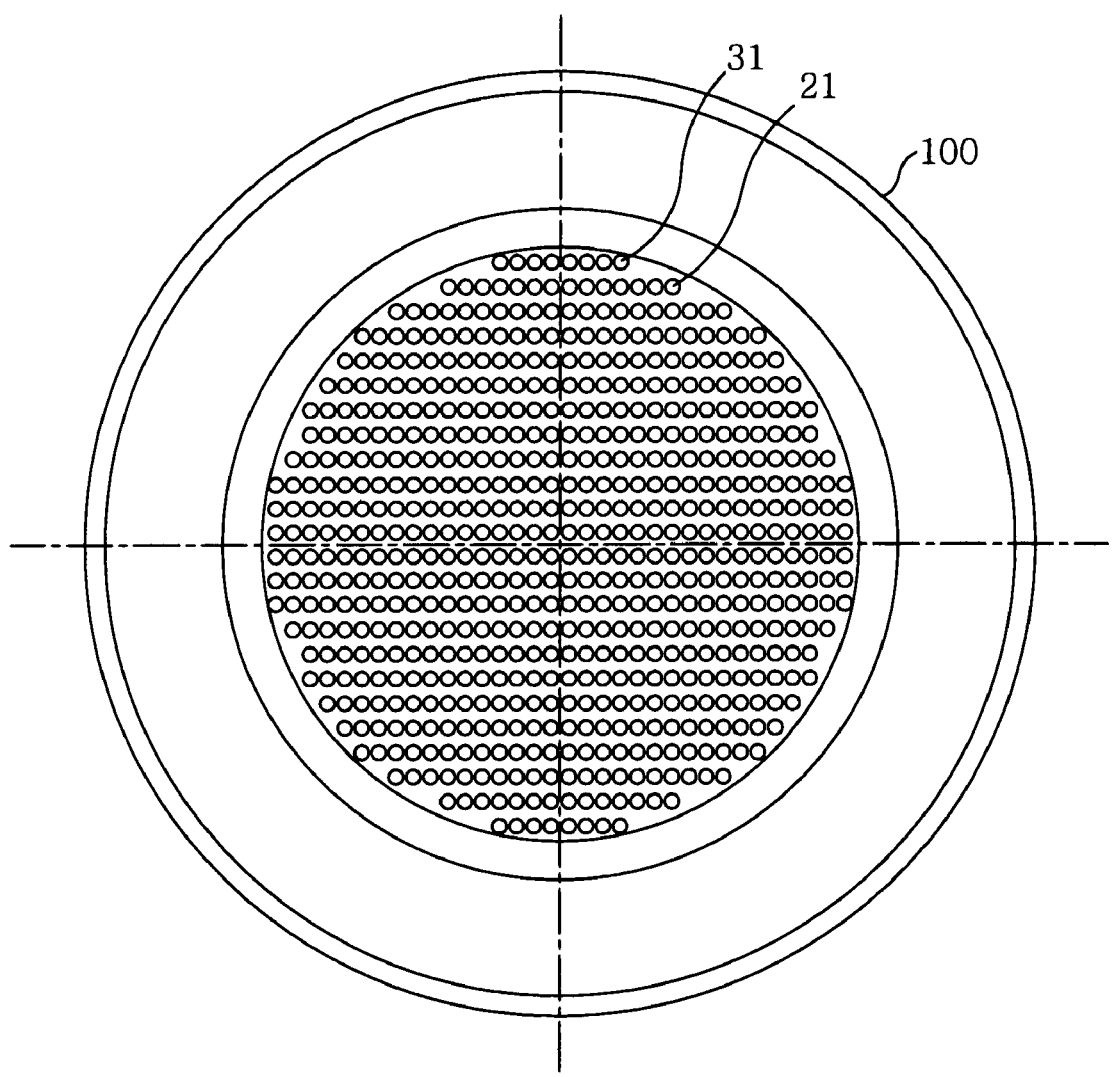
FIG. 3 illustrates a top view of the shower head of FIG. 1.

FIG. 3 shows an outer appearance configuration of the shower head 100 which is seen from the top. In the present embodiment, the outer appearance of the shower head 100 is formed in a circular plate shape in harmony with the outer appearance of the semiconductor wafer serving as a substrate to be processed. Further, the second gas injection openings 21 and the gas exhaust holes 31 are formed in a circular region. When the shower head 100 is seen from the bottom, the first gas injection openings 11 and the gas exhaust holes 31 are also formed in the circular region, as illustrated in FIG. 3. If a glass substrate for use in a liquid display device is used as a substrate to be processed, an outer appearance of the shower head 100 is formed in a quadrilateral shape in accordance with an outer appearance of the glass substrate.

Figure 2:
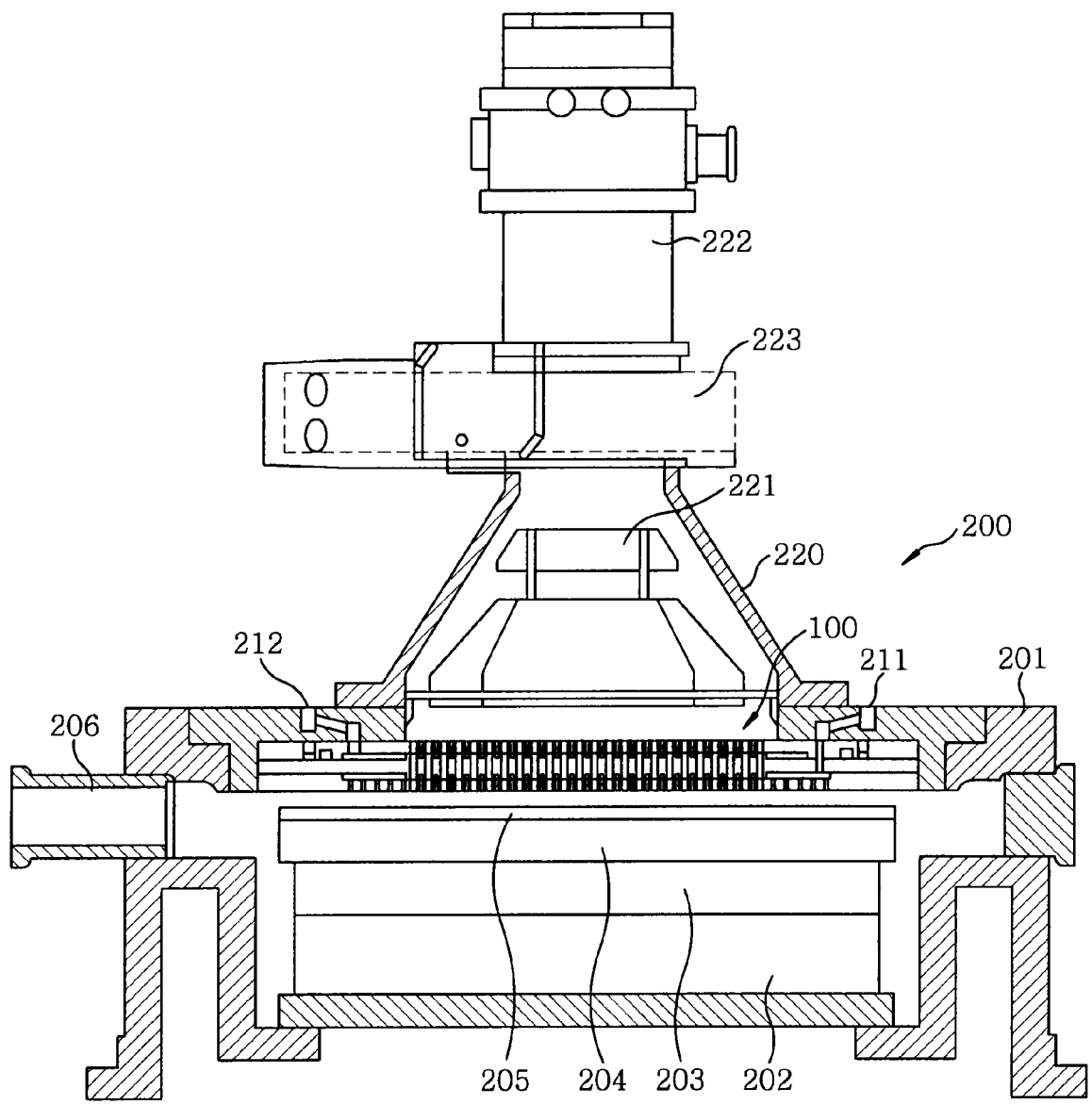
FIG. 2 describes a configuration of a plasma etching apparatus in accordance with a first embodiment of the present invention.

FIG. 2 depicts a configuration of the plasma etching apparatus 200 as a substrate processing apparatus having the shower head 100. The plasma etching apparatus 200 is configured as a capacitively coupled parallel plate type plasma etching apparatus including an upper and a lower electrode plate disposed to face each other in parallel and connected to a power supply for plasma generation.

The plasma etching apparatus 200 has a cylindrical processing chamber (processing vessel) 201 made of, e.g., aluminum whose surface is anodically oxidized, wherein the processing chamber 201 is grounded. A substantially columnar susceptor support 203 is installed at a bottom portion of the processing chamber 201 via an insulating plate 202 such as ceramic or the like. Further, a susceptor (mounting table) 204 which mounts thereon a semiconductor wafer as a substrate to be processed and serves as a lower electrode is mounted on the susceptor support 203. The susceptor 204 is connected to a high frequency power application unit (not shown) such as a high frequency power supply or the like.

Disposed on an upper portion of the susceptor 204 is an electrostatic chuck 205 for electrostatically attracting and holding the semiconductor wafer. The electrostatic chuck 205 includes an electrode embedded in insulating materials. The semiconductor wafer is electrostatically attracted and held by a Coulomb force generated by a DC voltage applied to the electrode.

The susceptor 204 is provided with a cooling mechanism (not shown), so that the temperature of the semiconductor wafer electrostatically attracted and held on the electrostatic chuck 205 can be adjusted to be maintained at a predetermined level. Formed on the side wall portion of the processing chamber 201 are an opening 206 for loading and unloading the semiconductor wafer into and from the processing chamber 201 and an opening/closing mechanism (gate valve) (not shown) for airtightly sealing the opening 206.

The shower head 100 shown in FIG. 1 is disposed above the susceptor 204 so as to face the susceptor 204 at a specific distance therefrom. Further, the shower head 100 serving as the upper electrode and the susceptor 204 serving as the lower electrode form a pair of facing electrodes.

The first and the second gas inlet portion 13 and 23 of the shower head 100 are respectively connected to a first and a second gas supply unit 211 and 212 provided in the processing chamber 201. A predetermined processing gas (etching gas) is supplied from a gas supply mechanism (not shown) to the first gas supply unit 211. Moreover, a pressure control gas such as $N_2$ gas, Ar gas or the like is supplied from a gas supply mechanism (not shown) to the second gas supply unit 212.

A trumpet-shaped gas exhaust port 220 having a diameter gradually reducing toward the top is provided at an upper portion of the shower head 100, and is connected to a vacuum pump 222 such as a turbo molecular pump or the like via an opening/closing control valve and an opening/closing mechanism 223. Further, the vacuum pump 222 is connected to a gas exhaust system (not shown). Furthermore, a filter unit 221 allows a gas to be discharged toward an upper portion of a processing space of the processing chamber 201 (a space between the shower head 100 and the susceptor 204). Accordingly, particles or the like that have been generated in the processing space of the processing chamber 201 and introduced into the gas exhaust unit 220 are prevented from backwardly flowing into the processing space of the processing chamber 201 and from entering the vacuum pump 222 or the like.

In order to perform a plasma etching on a semiconductor wafer by using the plasma etching apparatus 200 configured as described above, first, the semiconductor wafer is loaded into the processing chamber 201 through the opening 206, and is mounted on the electrostatic chuck 205. Next, the semiconductor wafer is electrostatically attracted and held on the electrostatic chuck 205. Thereafter, the opening 206 is closed, and the inner space of the processing chamber 201 is vacuum exhausted to be maintained at a predetermined vacuum level by the vacuum pump 222 and the like.

Then, a predetermined processing gas (etching gas) is supplied at a predetermined flow rate is supplied from the first gas supply unit 211 to the first gas inlet portion 13 of the shower head 100. Next, the processing gas is supplied in a shower shape through the first gas injection openings 11 to the semiconductor wafer W on the susceptor 204 via the first gas channel 12 of the shower head 100.

Meanwhile, the pressure control gas such as $N_2$ gas, Ar gas or the like is supplied from the second gas supply unit 212 to the second gas inlet portion 23 of the shower head 100, and then supplied through the second gas injection openings 21 to the side opposite to the semiconductor wafer on the susceptor 204, i.e., to the gas exhaust port 220, via the second gas channel 22 of the shower head 100.

The pressure control gas is used to control a pressure in the processing space of the processing chamber 201 where the semiconductor wafer is placed. Thus, when a flow rate of the pressure control gas increases, a pressure in the processing space increases. On the contrary, when a flow rate of the pressure control gas decreases, a pressure in the processing space decreases. Since the pressure control can be implemented quickly and with high accuracy by controlling a flow rate of the pressure control gas, the fine adjustment can be easily carried out. Further, the pressure control gas is supplied into the gas exhaust port 220 disposed on the backside of the shower head 100 without being supplied into the processing space where the semiconductor wafer is placed. Accordingly, it is possible to avoid change of the processing gas concentration in the processing space due to dilution, such change occurring when the pressure control gas is supplied into the processing space.

Thereafter, the pressure in the processing chamber 201 is maintained at a predetermined level and, then, a high frequency power of a predetermined frequency, e.g., 13.56 MHz, is applied to the susceptor 204. Accordingly, a high frequency electric field is generated between the shower head 100 serving as the lower electrode and the susceptor 204 serving as the upper electrode. As a consequence, the etching gas is dissociated and converted into a plasma, and a predetermined etching process is performed on the semiconductor wafer by the plasma thus generated.

In this etching process, the processing gas supplied in a shower shape through the first gas injection openings 11 of the shower head 100 is exhausted through the plurality of the gas exhaust holes 31 distributed over the shower head 100, so that the gas does not flow from the central portion to the peripheral portion of the semiconductor wafer unlike in the conventional case. Accordingly, the processing gas can be more uniformly supplied to the semiconductor wafer and, also, the etching process can be more uniformly performed in the respective portions of the semiconductor wafer. That is, the in-plane uniformity of the processing can be improved.

Upon the completion of the predetermined plasma etching process, the supply of the high frequency power and the supply of the processing gas are stopped, and the semiconductor wafer is unloaded from the processing chamber 201 in a reverse sequence of the steps described above.

As set forth above, in accordance with the plasma etching apparatus 200 of the present embodiment, the processing gas can be more uniformly supplied to the semiconductor wafer and, also, the etching process can be more uniformly performed in the respective portions of the semiconductor wafer.

Further, in the above plasma etching apparatus 200, a gas is exhausted through the gas exhaust holes 31 formed in the shower head 100, so that a gas exhaust path does not need to be provided at a periphery of the susceptor 204 or at a periphery of the shower head 100. Accordingly, a diameter of the processing chamber 201 can be made closer to an outer diameter of the semiconductor wafer serving as a substrate to be processed, which makes it possible to scale down the apparatus. Moreover, the vacuum pump 222 is provided above the processing chamber 201 and a gas is exhausted from a portion near the processing space of the processing chamber 201, which enables an effective discharge. Besides, a capacity of the vacuum pump 222 decreases and, hence, the apparatus can be further scaled down.

Further, since the second gas serving as the pressure control gas is directly supplied to the gas exhaust port 220 without passing through the processing space of the processing chamber 201, the pressure in the processing space can be controlled without diluting the processing gas in the processing space. Further, it is possible to control the pressure in the processing chamber quickly and accurately, and also possible to perform fine adjustment of the pressure in comparison with the case where a pressure is controlled by adjusting an opening degree of the valve of the gas exhaust system.

Figure 4:
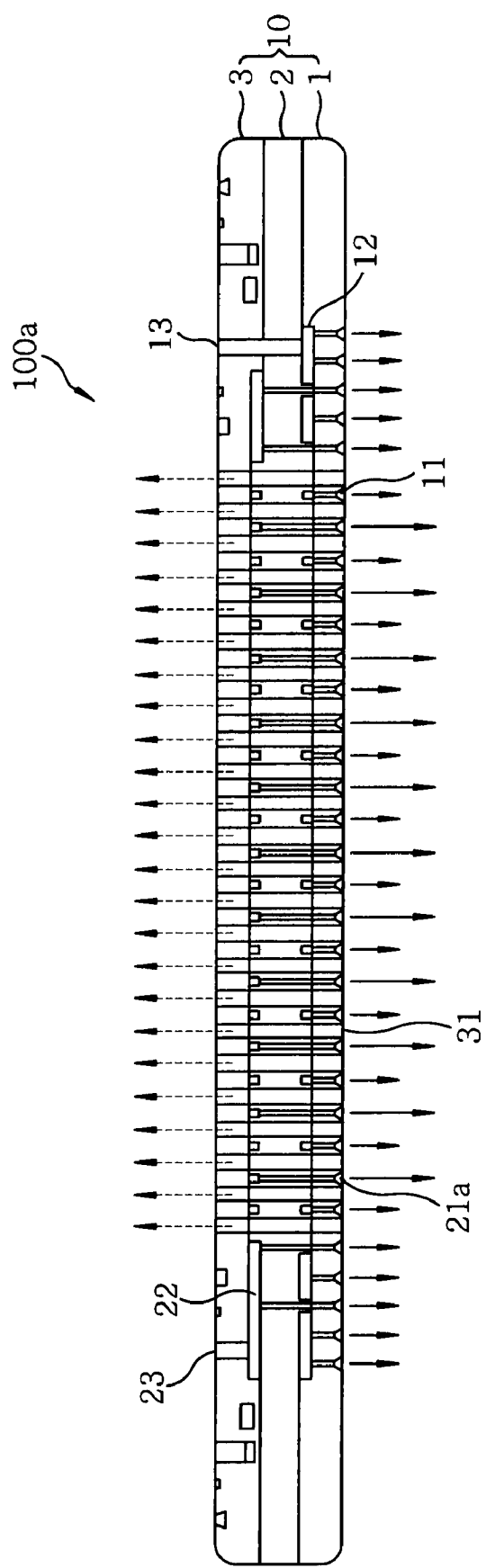
FIG. 4 depicts a configuration of a shower head in accordance with a second embodiment of the present invention.

FIG. 4 shows a configuration of a shower head 100a in accordance with a second embodiment of the present invention. In this shower head 100a, second gas injection openings 21a are formed through the intermediate member 2 and the lower member 1 to open toward the substrate, and the second gas is supplied through the second gas injection openings 21a toward the substrate. The configurations of other parts are the same as those of the embodiment shown in FIG. 1.

In the shower head 100a configured as described above, either the pressure control gas such as $N_2$ gas or a processing gas for use in processing the substrate can be supplied as the second gas supplied through the second gas injection openings 21a. In the case of supplying a processing gas as the second gas, a processing gas can be supplied as the second gas at the same time when a processing gas of different species is supplied through the first gas injection openings 11. Alternatively, a processing gas for pre- or post-process can also be supplied as the second gas before or after the supply of the processing gas through the first gas injection openings 11.

Figure 5:
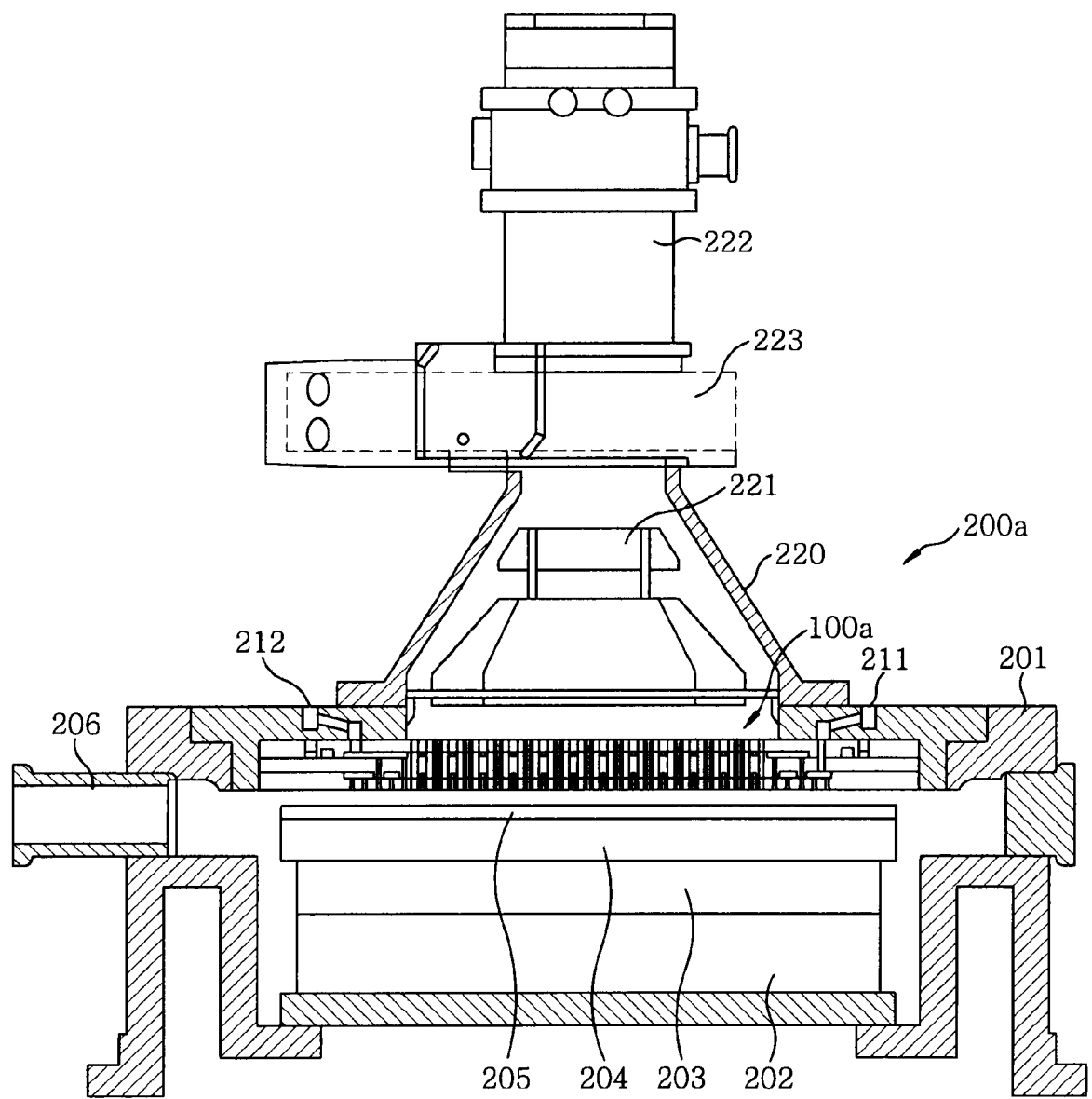
FIG. 5 shows a configuration of a substrate processing apparatus in accordance with a second embodiment of the present invention.

FIG. 5 illustrates a configuration of a plasma etching apparatus 200a in accordance with a second embodiment which includes the shower head 100a configured as described above. The configurations of the other parts except the shower head 100a of the plasma etching apparatus 200a are the same as those of the embodiment shown in FIG. 2. In the plasma etching apparatus 200a configured as described above, the processing gas supplied in a shower shape through the first and the second gas injection openings 11 and 21a of the shower head 100a is exhausted through the plurality of the gas exhaust holes 21 distributed over the shower head 100a, so that the gas does not flow from the central portion toward the peripheral portion of the semiconductor wafer unlike in the conventional case. Accordingly, the processing gas can be more uniformly supplied to the semiconductor wafer and, also, the etching process can be more uniformly performed in the respective portions of the semiconductor wafer. That is, the in-plane uniformity of the processing can be improved.

Further, in the above plasma etching apparatus 200a, a gas is exhausted through the gas exhaust holes 31 formed in the shower head 100a, so that the gas exhaust path does not need to be provided at a periphery of the susceptor 204 or at a periphery of the shower head 100. Accordingly, a diameter of the processing chamber 201 can be similar to an outer diameter of the semiconductor wafer serving as a substrate to be processed, which makes it possible to scale down the apparatus. Moreover, the vacuum pump 222 is provided above the processing chamber 201 and a gas is exhausted from a portion near the processing space of the processing chamber 201, which enables an effective discharge. Besides, a capacity of the vacuum pump 222 decreases and, hence, the apparatus can be further scaled down.

In the case where the pressure control gas is supplied as the second gas, it is possible to control the pressure in the processing space of the processing chamber 201 quickly and accurately, and also possible to perform the fine adjustment of the pressure in comparison with the case where the pressure is controlled by adjusting an opening degree of the valve of the gas exhaust system.

Figure 6:
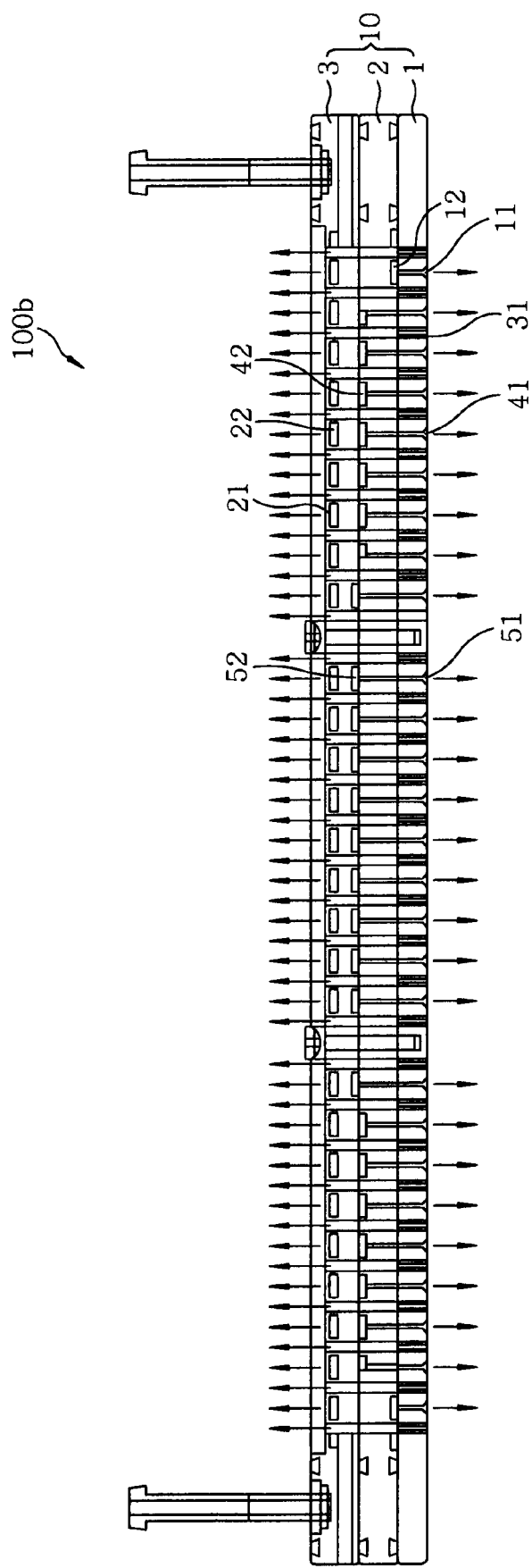
FIG. 6 describes a configuration of a shower head in accordance with a third embodiment of the present invention.

FIG. 6 shows a configuration of a shower head 100b in accordance with a third embodiment of the present invention. This shower head 100b includes, in addition to the first and the second gas injection openings 11 and 21 of the shower head 100, third gas injection openings 41 for supplying a third gas and fourth gas injection openings 51 for supplying a fourth gas. Accordingly, respective gases can be supplied from the first, the third and the fourth gas injection openings 11, 41 and 51 to three different regions on the substrate (lower side of FIG. 6).

That is, in the shower head 100b, the first gas injection openings 11 are formed at a peripheral portion, and communicate with the first gas channel 12 formed between the lower member 1 and the intermediate member 2, thus supplying the first gas to the peripheral region of the substrate. Moreover, the third gas injection openings 41 are formed at an intermediate portion between a central portion and the peripheral portion, and communicate with the third gas channel 42 formed between the intermediate member 2 and the upper member 3, thereby supplying the third gas to an intermediate region of the substrate. Furthermore, the fourth gas injection openings 51 are formed at the central portion, and communicate with the fourth gas channel 52 formed between the intermediate member 2 and the upper member 3, thus supplying the fourth gas to a central region of the substrate. Further, the second gas is supplied from the second gas injection openings 21 toward the side opposite to the substrate (upper side of FIG. 6).

As for the second gas, a pressure control gas such as $N_2$ gas or the like is supplied from the second gas injection openings 21.

As for each of the first gas supplied from the first gas injection openings 11, the third gas supplied from the third gas injection openings 41, and the fourth gas supplied from the fourth gas injection openings 51, it is possible to supply either the pressure control gas such as $N_2$ gas or a processing gas for use in processing a substrate. If processing gases are supplied, different kinds of processing gases can be simultaneously supplied through the respective gas injection openings, or processing gases for pre- and post-process can also be supplied before and after the supply of the main processing gas. In addition, the same processing gas can be simultaneously supplied through the respective gas injection openings. In this case, the processing gas supplied through the respective gas injection openings can have different flow rates. For example, when a processing speed at the peripheral portion of the substrate is slow, a large amount of the processing gas is supplied from the first gas injection openings 11 to increase the processing speed at the peripheral portion of the substrate. In this manner, the in-plane uniformity of the processing can be controlled. The shower head 100b of the third embodiment can be used in the plasma etching apparatus 200 of FIG. 2 instead of the shower head 100 of the first embodiment.

Figure 7:
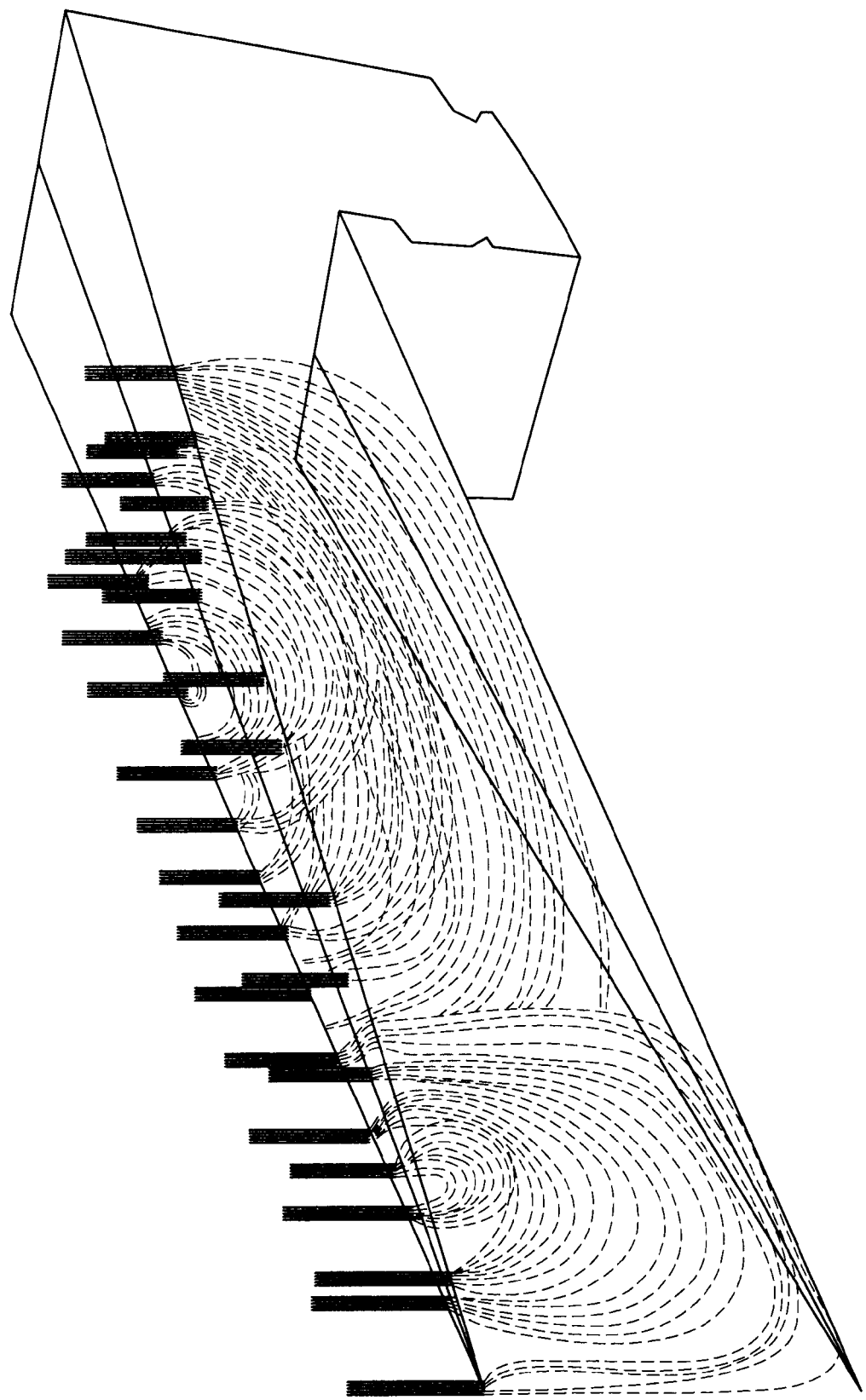
FIG. 7 offers a simulation result of a gas flow in the shower head of the first embodiment.
Figure 8:
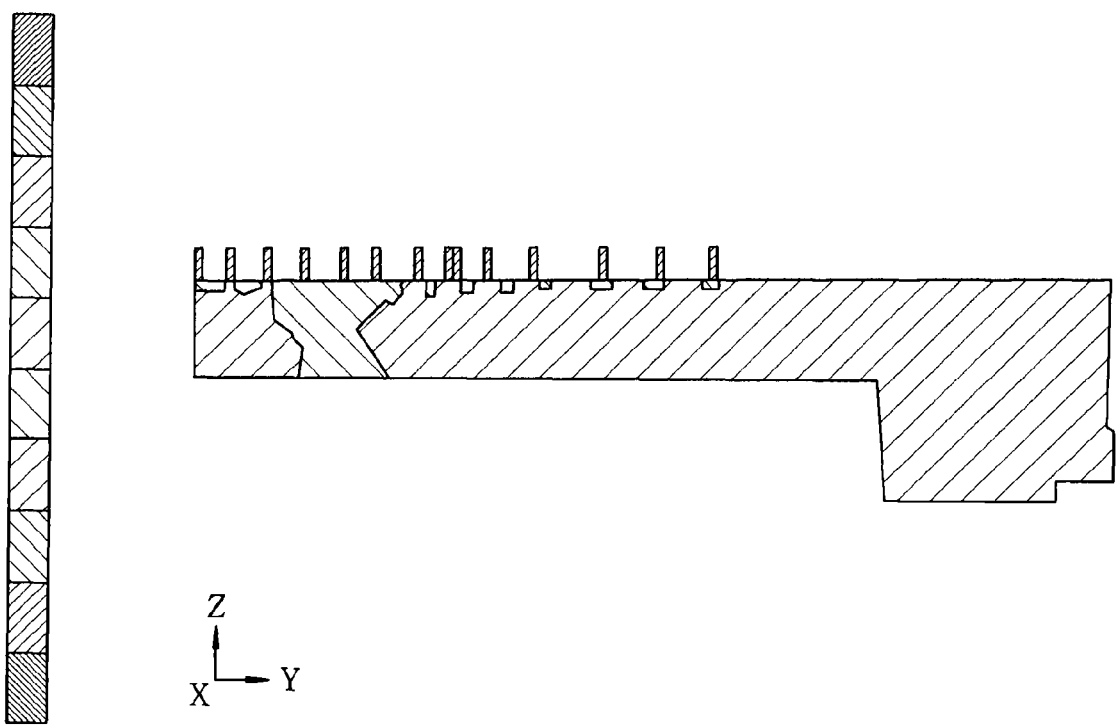
FIG. 8 presents a vertical cross sectional pressure distribution in the simulation of FIG. 7.
Figure 9:
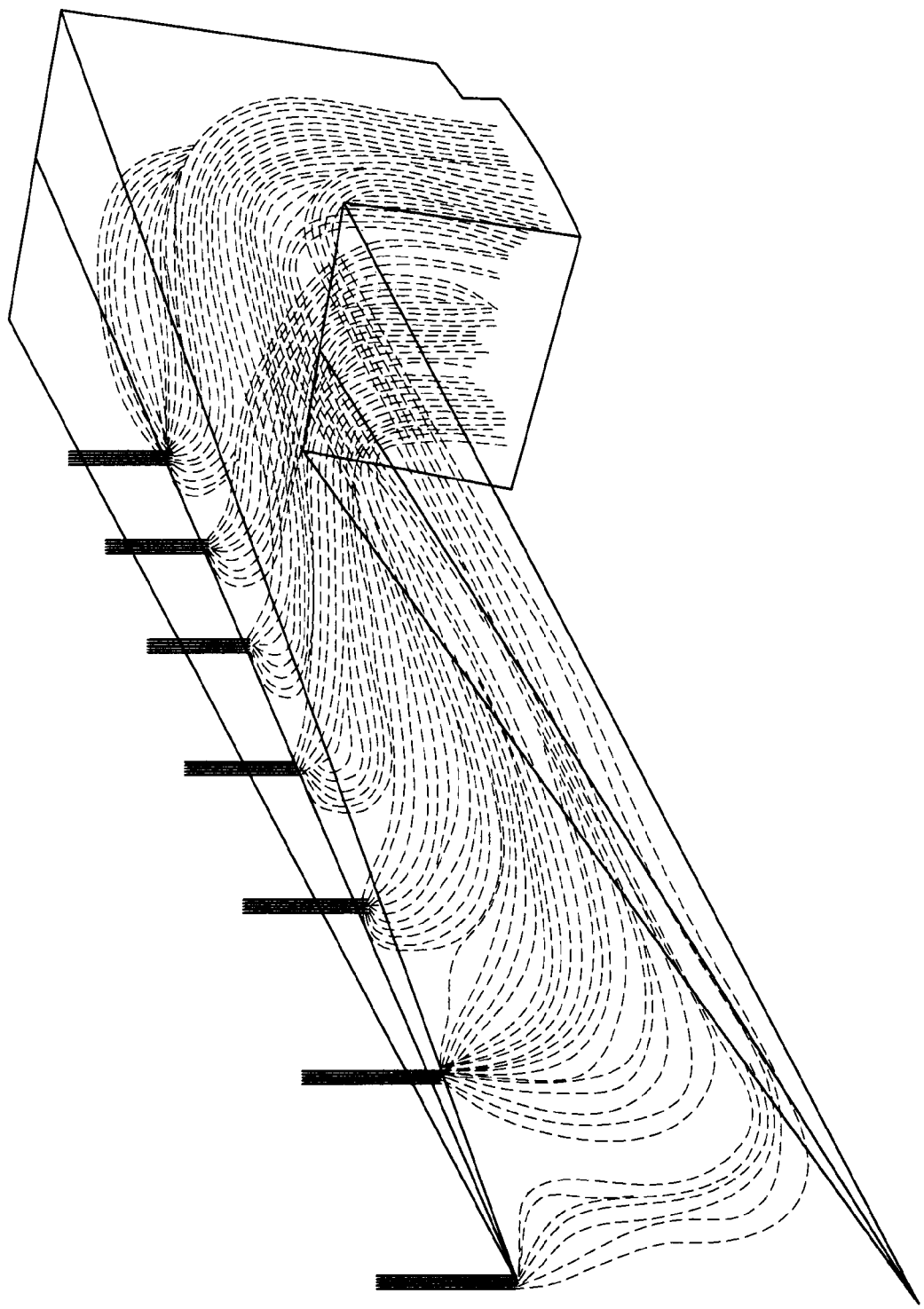
FIG. 9 illustrates a simulation result of a gas flow in a conventional shower head.
Figure 10:
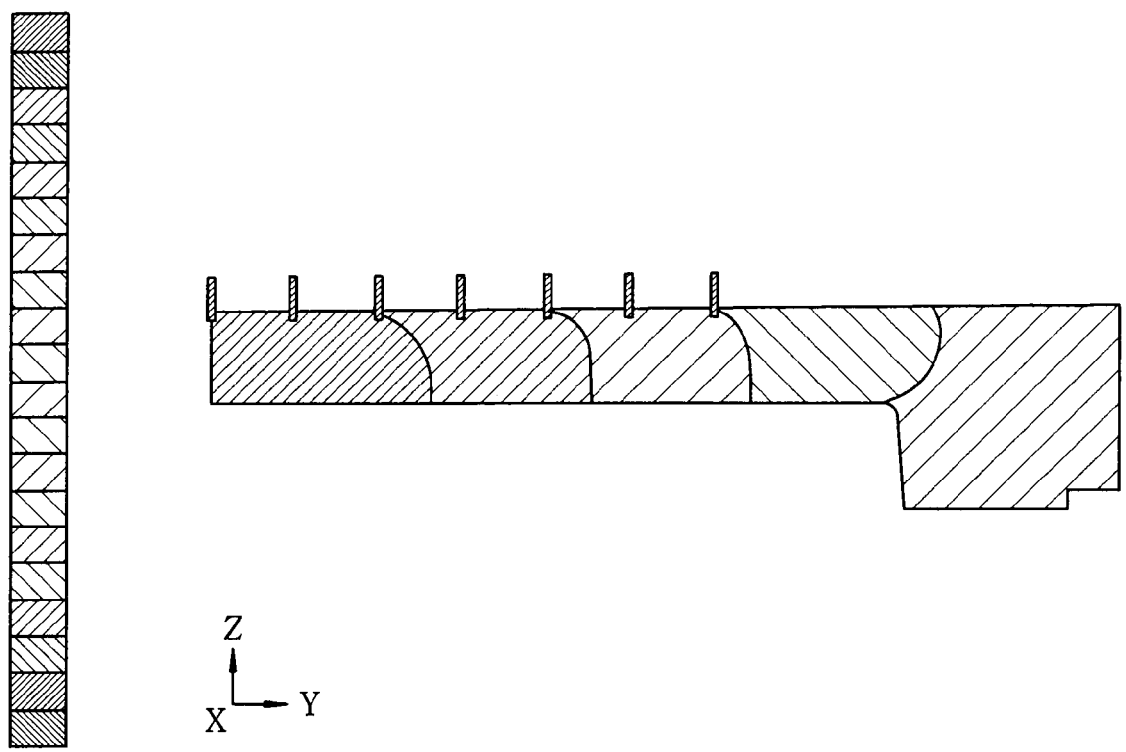
FIG. 10 shows a vertical cross sectional pressure distribution in the simulation of FIG. 9.

FIG. 7 presents a simulation result of a gas flow in the shower head 100 of the first embodiment. FIG. 8 represents a simulation result of a vertical cross sectional pressure distribution. Meanwhile, FIGS. 9 and 10 illustrate a result of the same simulation carried out in a conventional shower head in which a gas is supplied from the shower head and exhausted through the lower portion of a processing chamber. Referring to FIGS. 8 and 10, pressure ranges of varying magnitudes are represented by different types of hatchings shown in the left sides of the drawings. Therefore, the pressure distribution becomes more uniform as a smaller number of different hatchings are presented in partial areas of the chamber shown in the right sides of the drawings.

When FIG. 7 is compared with FIG. 9, it is clear that, in a conventional shower head, a gas flow line becomes long and, thus, the gas supplied to the vicinity of the central portion of the substrate transverses the substrate surface and reaches the peripheral portion of the substrate. On the other hand, in the shower head 100 of the first embodiment, a gas flow line becomes short, so that different processing gases are supplied to the respective portions of the substrate. Moreover, in the shower head 100 of the first embodiment, the pressure distribution in the vertical cross sectional direction is more uniform than that in the conventional shower head.

The present invention is not limited to the above embodiment, and may be variously modified.

For example, although the present invention is applied to the plasma etching apparatus in the above embodiment, the present invention may also be applied to a film forming apparatus such as a CVD apparatus or the like or to another substrate processing apparatus other than the plasma etching apparatus. Further, although the shower head is at a ground potential in the above embodiment, the present invention may be applied to an apparatus in which a high frequency power is applied to the shower head.

While the invention has been shown and described with respect to the embodiments, it will be understood by those skilled in the art that various changes and modification may be made without departing from the scope of the invention as defined in the following claims.

What is claimed is:

1. A shower head provided in a processing chamber for processing a substrate therein to face a mounting table for mounting thereon the substrate and formed of a laminated body in which a plurality of plate-shaped members are laminated, the shower head serving to supply one or more gases toward the substrate, the shower head comprising:

a first gas supply unit having a first gas channel and first gas injection openings in the laminated body for supplying a first gas to the first gas injection openings through the first gas channel, and then supplying the first gas toward the substrate through the first gas injection openings;

a plurality of gas exhaust holes, formed through the laminated body, for exhausting the first gas in a processing space between the laminated body and the mounting table to a gas exhaust port; and a second gas supply unit having a second gas channel and second gas injection openings in the laminated body for supplying a second gas to the second gas injection openings through the second gas channel, and then supplying the second gas toward the gas exhaust port through the second gas injection openings, wherein the second gas channel has a structure such that the second gas is not supplied to the processing space.

2. The shower head of claim 1, further comprising a third gas supply unit for supplying a third gas through third gas injection openings provided in the laminated body.

3. The shower head of claim 2, further comprising a fourth gas supply unit for supplying a fourth gas through fourth gas injection openings provided in the laminated body.

4. The shower head of claim 1, wherein the shower head serves as a facing electrode facing the mounting table.

5. A substrate processing apparatus comprising:
a processing chamber for processing a substrate therein;
a mounting table, provided in the processing chamber, for mounting thereon the substrate;
a shower head, provided to face the mounting table, for supplying one or more gases toward the substrate; and
a gas exhaust port provided at an upper portion of the shower head,
wherein the shower head includes:
a first gas supply unit having a first gas channel and first gas injection openings in the laminated body for supplying a first gas to the first gas injection openings through the first gas channel, and then supplying the first gas toward the substrate through the first gas injection openings;
a plurality of gas exhaust holes, formed through the laminated body, for exhausting the first gas in a processing space between the laminated body and the substrate to the gas exhaust port; and
a second gas supply unit having a second gas channel and second gas injection openings in the laminated body for supplying a second gas to the second gas injection openings through the second gas channel, and then supplying the second gas toward the gas exhaust port through the second gas injection openings,
wherein the second gas channel has a structure such that the second gas is not supplied to the processing space.

6. The substrate processing apparatus of claim 5, further comprising a third gas supply unit for supplying a third gas through third gas injection openings provided in the laminated body.

7. The substrate processing apparatus of claim 6, further comprising a fourth gas supply unit for supplying a fourth gas through fourth gas injection openings provided in the laminated body.

8. The substrate processing apparatus of claim 5, wherein the shower head serves as a facing electrode facing the mounting table.

9. The substrate processing apparatus of claim 8, wherein a high frequency power is applied between the shower head and the mounting table to generate a plasma, and the substrate is processed by using the plasma.

10. The substrate processing apparatus of claim 9, wherein the substrate is etched by the plasma.

11. The shower head of claim 1, wherein a pressure in the processing space is controlled by adjusting a flow rate of the second gas.

12. The shower head of claim 1, wherein the second gas includes at least one of $N_2$ gas and Ar gas.

13. The substrate processing apparatus of claim 5, wherein a pressure in the processing space is controlled by adjusting a flow rate of the second gas.

14. The substrate processing apparatus of claim 5, wherein the second gas includes at least one of $N_2$ gas and Ar gas.

15. The shower head of claim 1, wherein the second gas injection openings are formed in an upper portion of the laminated body.

16. The shower head of claim 1, wherein the laminated body includes a lower member; an intermediate member disposed above the lower member; and an upper member provided above the intermediate member, and
wherein the second gas injection openings are formed in the upper member.

17. The substrate processing apparatus of claim 16, wherein the second gas channel is formed between the upper member and the intermediate member and communicates with the second gas injection openings.

18. The substrate processing apparatus of claim 5, wherein the second gas injection openings are formed in an upper portion of the laminated body.

19. The substrate processing apparatus of claim 5, wherein the laminated body includes a lower member; an intermediate member disposed above the lower member; and an upper member provided above the intermediate member, and
wherein the second gas injection openings are formed in the upper member.

20. The substrate processing apparatus of claim 19, wherein the second gas channel is formed between the upper member and the intermediate member and communicates with the second gas injection openings.

* * * * *